US012740075B2

(12) United States Patent
Ayyapureddi

(10) Patent No.: US 12,740,075 B2
(45) Date of Patent: Sep. 15, 2026

(54) STACKED MEMORY DEVICE WITH IMPROVED PER-DIE POWER DELIVERY

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 18/939,265

(22) Filed: Nov. 6, 2024

(65) Prior Publication Data

US 2025/0194111 A1 Jun. 12, 2025

Related U.S. Application Data

(60) Provisional application No. 63/609,337, filed on Dec. 12, 2023.

(51) Int. Cl.

| | |
|---|---|
| ***G11C 11/4074*** | (2006.01) |
| ***H10B 80/00*** | (2023.01) |
| ***H10W 90/00*** | (2026.01) |
| *H10W 72/00* | (2026.01) |
| *H10W 90/20* | (2026.01) |

(52) U.S. Cl.

CPC .......... *H10B 80/00* (2023.02); *G11C 11/4074* (2013.01); *H10W 90/00* (2026.01); *H10W 72/01* (2026.01); *H10W 90/297* (2026.01)

(58) Field of Classification Search

CPC ..... H10B 80/00; H10W 90/00; G11C 11/4074

USPC .......................................................... 365/226

See application file for complete search history.

(56) References Cited

U.S. PATENT DOCUMENTS

| | | | | |
|---|---|---|---|---|
| 2013/0272049 | A1 | 10/2013 | Shoemaker et al. | |
| 2015/0081989 | A1* | 3/2015 | Lee | G06F 12/0607 711/157 |
| 2019/0043807 | A1* | 2/2019 | Redaelli | H10B 63/80 |
| 2020/0049767 | A1 | 2/2020 | Kim et al. | |
| 2020/0118605 | A1* | 4/2020 | Hollis | G06F 13/1668 |
| 2021/0225413 | A1* | 7/2021 | Shibata | G11C 5/063 |

OTHER PUBLICATIONS

International Application No. PCT/US2024/055804—PCT International Search Report and Written Opinion; mailed Feb. 28, 2025; 9 pages.

* cited by examiner

*Primary Examiner* — Muna A Techane

(74) *Attorney, Agent, or Firm* — Dorsey & Whitney LLP

(57) ABSTRACT

A memory device including a plurality of memory dies positioned in a stack, the plurality of memory dies including a first set of memory dies having a first number of channels configured according to a first configuration and a second number of channels configured according to a second configuration, wherein the first configuration comprises channels configured to have a first bandwidth and operate in a first bandwidth mode, and the second configuration comprises channels configured to have a second bandwidth and operate in a second bandwidth mode, and a second set of memory dies having a third number of channels configured according to the first configuration and a fourth number of channels configured according to the second configuration, wherein the first bandwidth is larger than the second bandwidth, the first number is larger than the third number, and the second number is larger than the fourth number.

20 Claims, 9 Drawing Sheets

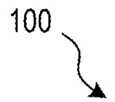
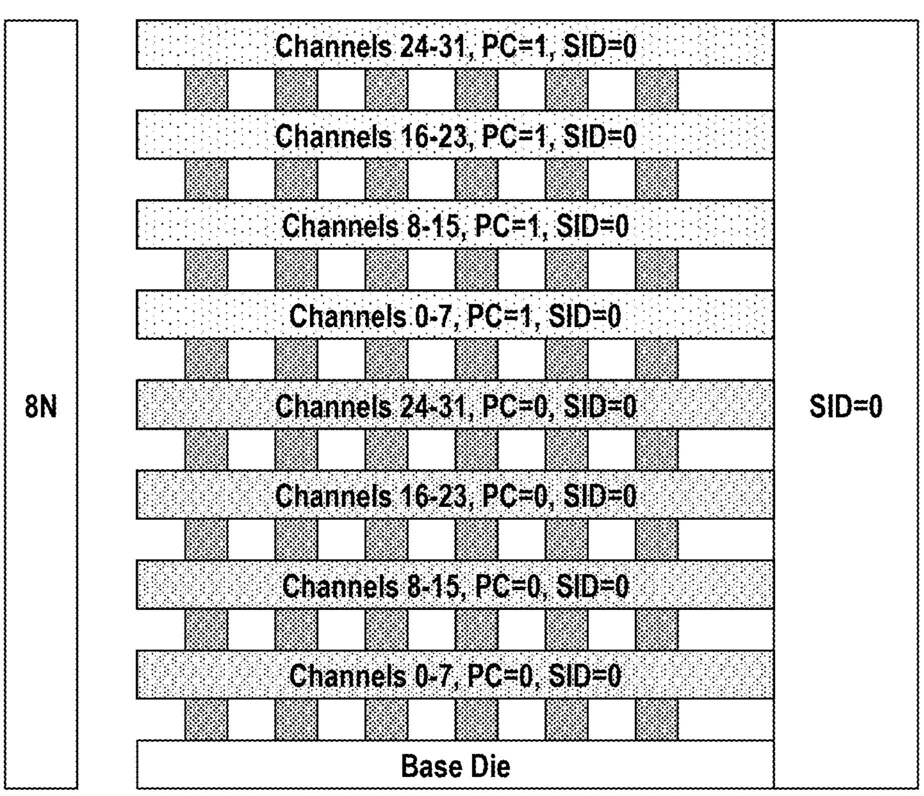
*FIG. 1*

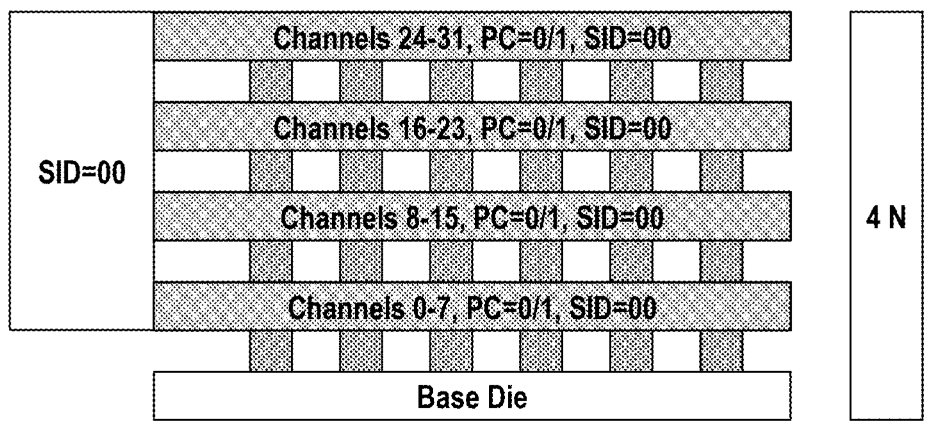
*FIG. 2*

| | | | CH0 | CH1 | CH2 | CH3 | CH4 | CH5 | CH6 | CH7 | GB/s |
|---|---|---|---|---|---|---|---|---|---|---|---|
| 8N | PC0 | Die0 | 0 | 1 | 2 | 3 | 4 | 5 | 6 | 7 | 307.2 |
| | | Die1 | 8 | 9 | 10 | 11 | 12 | 13 | 14 | 15 | 307.2 |
| | | Die2 | 16 | 17 | 18 | 19 | 20 | 21 | 22 | 23 | 307.2 |
| | | Die3 | 24 | 25 | 26 | 27 | 28 | 29 | 30 | 31 | 307.2 |
| | PC1 | Die4 | 0 | 1 | 2 | 3 | 4 | 5 | 6 | 7 | 307.2 |
| | | Die5 | 8 | 9 | 10 | 11 | 12 | 13 | 14 | 15 | 307.2 |
| | | Die6 | 16 | 17 | 18 | 19 | 20 | 21 | 22 | 23 | 307.2 |
| | | Die7 | 24 | 25 | 26 | 27 | 28 | 29 | 30 | 31 | 307.2 |
| 4N | PC0/1 | Die8 | 0 | 1 | 2 | 3 | 4 | 5 | 6 | 7 | 614.4 |
| | | Die9 | 8 | 9 | 10 | 11 | 12 | 13 | 14 | 15 | 614.4 |
| | | Die10 | 16 | 17 | 18 | 19 | 20 | 21 | 22 | 23 | 614.4 |
| | | Die11 | 24 | 25 | 26 | 27 | 28 | 29 | 30 | 31 | 614.4 |

400

| | CH0 | CH1 | CH2 | CH3 | CH4 | CH5 | CH6 | CH7 | GB/s |
|---|---|---|---|---|---|---|---|---|---|
| Die0 | 0, 4N | 1, 4N | 2, 4N | 3, 4N | 4 | 5 | 6 | 7 | 460.8 |
| Die1 | 8, 4N | 9, 4N | 10, 4N | 11, 4N | 12 | 13 | 14 | 15 | 460.8 |
| Die2 | 16, 4N | 17, 4N | 18, 4N | 19, 4N | 20 | 21 | 22 | 23 | 460.8 |
| Die3 | 24, 4N | 25, 4N | 26, 4N | 27, 4N | 28 | 29 | 30 | 31 | 460.8 |
| Die4 | 0 | 1 | 2 | 3 | 4 | 5 | 6 | 7 | 307.2 |
| Die5 | 8 | 9 | 10 | 11 | 12 | 13 | 14 | 15 | 307.2 |
| Die6 | 16 | 17 | 18 | 19 | 20 | 21 | 22 | 23 | 307.2 |
| Die7 | 24 | 25 | 26 | 27 | 28 | 29 | 30 | 31 | 307.2 |
| Die8 | 0 | 1 | 2 | 3 | 4, 4N | 5, 4N | 6, 4N | 7, 4N | 460.8 |
| Die9 | 8 | 9 | 10 | 11 | 12, 4N | 13, 4N | 14, 4N | 15, 4N | 460.8 |
| Die10 | 16 | 17 | 18 | 19 | 20, 4N | 21, 4N | 22, 4N | 23, 4N | 460.8 |
| Die11 | 24 | 25 | 26 | 27 | 28, 4N | 29, 4N | 30, 4N | 31, 4N | 460.8 |

| | CH0 | CH1 | CH2 | CH3 | CH4 | CH5 | CH6 | CH7 | GB/s |
|---|---|---|---|---|---|---|---|---|---|
| Die0 | 0, 4N | 1, 4N | 2, 4N | 3 | 4 | 5 | 6 | 7 | 422.4 |
| Die1 | 8, 4N | 9, 4N | 10, 4N | 11 | 12 | 13 | 14 | 15 | 422.4 |
| Die2 | 16, 4N | 17, 4N | 18, 4N | 19 | 20 | 21 | 22 | 23 | 422.4 |
| Die3 | 24, 4N | 25, 4N | 26, 4N | 27 | 28 | 29 | 30 | 31 | 422.4 |
| Die4 | 0 | 1 | 2 | 3, 4N | 4 | 5 | 6 | 7, 4N | 384 |
| Die5 | 8 | 9 | 10 | 11, 4N | 12 | 13 | 14 | 15, 4N | 384 |
| Die6 | 16 | 17 | 18 | 19, 4N | 20 | 21 | 22 | 23, 4N | 384 |
| Die7 | 24 | 25 | 26 | 27, 4N | 28 | 29 | 30 | 31, 4N | 384 |
| Die8 | 0 | 1 | 2 | 3 | 4, 4N | 5, 4N | 6, 4N | 7 | 422.4 |
| Die9 | 8 | 9 | 10 | 11 | 12, 4N | 13, 4N | 14, 4N | 15 | 422.4 |
| Die10 | 16 | 17 | 18 | 19 | 20, 4N | 21, 4N | 22, 4N | 23 | 422.4 |
| Die11 | 24 | 25 | 26 | 27 | 28, 4N | 29, 4N | 30, 4N | 31 | 422.4 |

| | CH0 | CH1 | CH2 | CH3 | CH4 | CH5 | CH6 | CH7 | GB/s |
|---|---|---|---|---|---|---|---|---|---|
| Die0 | 0, 4N | 1, 4N | 2 | 3, 4N | 4 | 5 | 6 | 7 | 422.4 |
| Die1 | 8, 4N | 9, 4N | 10 | 11, 4N | 12 | 13 | 14 | 15 | 422.4 |
| Die2 | 16, 4N | 17, 4N | 18 | 19, 4N | 20 | 21 | 22 | 23 | 422.4 |
| Die3 | 24, 4N | 25, 4N | 26 | 27, 4N | 28 | 29 | 30 | 31 | 422.4 |
| Die4 | 0 | 1 | 2, 4N | 3 | 4 | 5 | 6 | 7, 4N | 384 |
| Die5 | 8 | 9 | 10, 4N | 11 | 12 | 13 | 14 | 15, 4N | 384 |
| Die6 | 16 | 17 | 18, 4N | 19 | 20 | 21 | 22 | 23, 4N | 384 |
| Die7 | 24 | 25 | 26, 4N | 27 | 28 | 29 | 30 | 31, 4N | 384 |
| Die8 | 0 | 1 | 2 | 3 | 4, 4N | 5, 4N | 6, 4N | 7 | 422.4 |
| Die9 | 8 | 9 | 10 | 11 | 12, 4N | 13, 4N | 14, 4N | 15 | 422.4 |
| Die10 | 16 | 17 | 18 | 19 | 20, 4N | 21, 4N | 22, 4N | 23 | 422.4 |
| Die11 | 24 | 25 | 26 | 27 | 28, 4N | 29, 4N | 30, 4N | 31 | 422.4 |

Provide the memory device comprising a vertical stack of memory dies, a channel-mix setting, and a plurality of electrical fuses each being associated with corresponding memory channel
710

Determine a bandwidth mode from a set of bandwidth modes for each memory channel based on a position of the memory channel on the die, the DID of the die, and the channel-mix setting of the memory device
720

Configure the plurality of electrical fuses, in accordance with the determined bandwidth mode to each of the memory channels, to operate each of the memory channels in corresponding bandwidth mode
730

*FIG. 7*

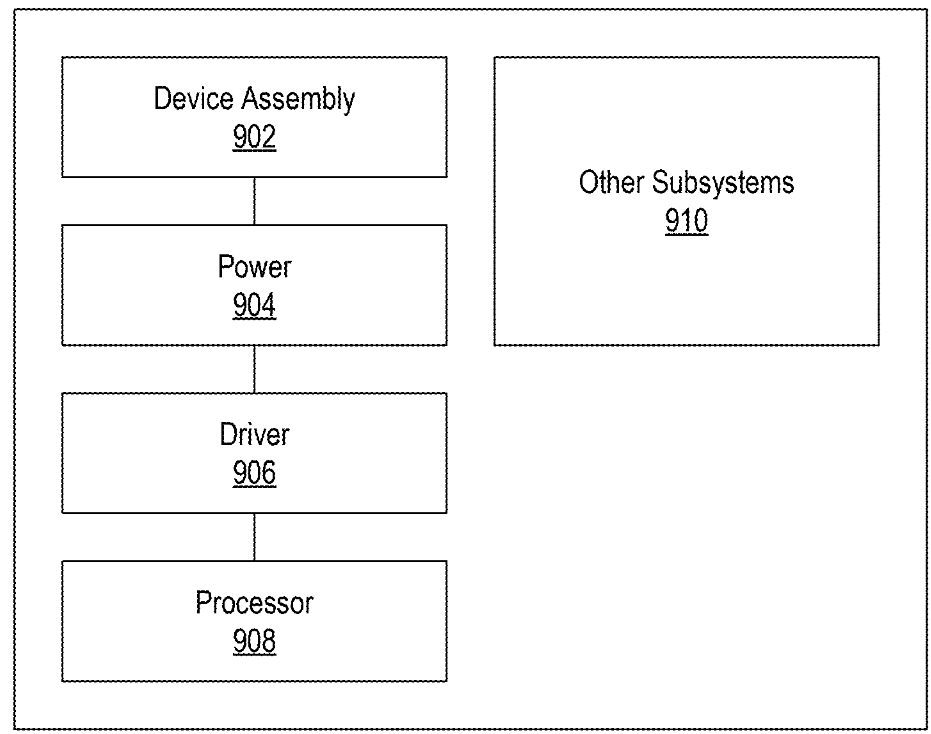
*FIG. 9*

STACKED MEMORY DEVICE WITH IMPROVED PER-DIE POWER DELIVERY

CROSS-REFERENCE TO RELATED APPLICATION(S)

The present application claims priority to U.S. Provisional Patent Application No. 63/609,337, filed Dec. 12, 2023, the disclosure of which is incorporated herein by reference in its entirety.

TECHNICAL FIELD

The present disclosure generally relates to stacked semiconductor memory devices, and more particularly relates to stacked memory devices with improved per memory die power delivery.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read-only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 1 illustrates an example memory device.

FIG. 2 illustrates an example memory device.

FIG. 7 illustrates a flow chart illustrating a method of improved power delivery in a memory device, in accordance with one or more embodiments of the present technology.

FIG. 9 illustrates a block diagram of a system that includes a semiconductor memory device configured in accordance with one or more embodiments of the present technology.

DETAILED DESCRIPTION

Figure 3:
FIG. 3 illustrates channel configurations of an example memory device.

High data reliability, high speed of memory access, lower power consumption and reduced chip size are features that are demanded from semiconductor memory. In recent years, three-dimensional (3D) memory devices have been introduced. Some 3D memory devices are formed by stacking dice vertically and interconnecting the dice using through-silicon (or through-substrate) vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption, and chip size reduction. Example 3D memory devices include Hybrid Memory Cube (HMC) and High Bandwidth Memory (HBM). For example, HBM is a type of memory including a high-performance random access memory (DRAM) interface and vertically stacked DRAM.

A HBM device may be comprised of a vertical stack of different numbers of memories dies (e.g., DRAM dies), such as a stack of eight memory dies stacked vertically onto another (referred to as eight-high, 8-Hi, or an 8H stack), twelve memory dies stacked vertically onto another (referred to as twelve-high, 12-Hi, or a 12H stack), etc. Additionally, the HBM device may include multiple independent channels used to communicate with a host coupled to the HBM device (e.g., a CPU, GPU, memory controller, etc.). Each channel may include its own clock, command/address, and data interface, to enable operations that are independent of the channels. For example, an HBM device may include 32 channels (e.g., channels 0-31).

Each of the memory dies of the HBM device can include multiple channels, through which the memory of the memory die is accessed. For example, each memory die may include 2 channels, 4 channels, etc. Furthermore, different memory dies within the HBM device may operate to provide different bandwidths via their respective channels. Within an HBM device, different numbers of memory dies may be used to provide equivalent bandwidths, depending on the per-die bandwidths of the memory dies. For example, if an HBM device includes memory dies of two different bandwidths (e.g., full-bandwidth memory dies and half-bandwidth memory dies), the HBM device may include twice as many half-bandwidth memory dies as full-bandwidth memory dies, such that the half-bandwidth dies provide the same total bandwidth as the full-bandwidth memory dies. Furthermore, memory dies may be characterized based on the number of memory dies needed to achieve a target bandwidth. For example, an 8N die represents a memory die for which eight of that die is needed to achieve a target bandwidth, and a 4N die represents a memory die for which four of that die is needed to achieve the target bandwidth.

FIG. 1 illustrates a conventional 8H stack HBM device 100 implemented as eight memory dies stacked vertically onto one another, where the eight memory dies are split into two four-die halves. As illustrated, the HBM device 100 includes 32 channels, where the channels are assigned evenly to the dies of a four-die half (e.g., 8 channels are assigned to each die, for 32 channels total in the four-die half), and the 32 channels are assigned to both four-die halves (i.e., channels 0-31 are assigned to both four-die halves). Each half of the eight-die stack can be associated with a distinct pseudo channel (PC) (e.g., the 32 channels distributed over the first half of the stack represent first pseudo channels, and the 32 channels distributed over the second half of the stack represent second pseudo channels). In the HBM device 100 illustrated in FIG. 1, the entire eight die stack may be needed to satisfy the requirements of an HBM specification (e.g., 32 channels further subdivided into two pseudo channels), and therefore the architecture illustrated in FIG. 1 can be referred to as an 8N architecture because the requirements of the HBM specification is satisfied using eight dies. For example, HBM4 may be referred to as an 8N architecture, as 8 memory dies are needed to form a self-sustaining cube that is compliant with the specification. Furthermore, the individual memory dies of the HBM device 100 may be referred to as 8N memory dies, and the channels therein may be referred to as 8N channels.

HBM devices can also be implemented with a 4N architecture, as illustrated in FIG. 2, such that a four-die stack can satisfy the requirements of the HBM specification. For example, each memory die of the four-die stack can implement both the first and second pseudo channels for each channel (in contrast to the device illustrated in FIG. 1, where each memory die is associated with only a single pseudo channel). As shown in FIG. 2, the channels of the 4H stack HBM device 200 can be distributed evenly over a four-die stack, and banks of each channel can be divided equally between the first and second pseudo channel. The individual memory dies of the HBM device 200 may be referred to as 4N memory dies, and the channels therein may be referred to as 4N channels. As described herein, the 4N channels may provide a greater (e.g., twice the) bandwidth of the 8N channels (illustrated in the HBM device 100 of FIG. 1). As a result, as described herein, 4N channels may consume more power than 8N channels.

Channel Configurations of Example 12H HBM Devices

To implement a 12-die device, the die stack with a 4N architecture can be implemented three times, with a different single stack identifier (SID) assigned to each stack. Given that each individual four-die stack of the HBM device is symmetric, the 12-die device implemented with the 4N architecture can be symmetric. There are, however, various shortcomings with implementing a 12H HBM stack using three sets of 4N architected memory dies. During operation, communicating signaling to different die stacks having different SIDs can require additional time. The 4N architecture can impose certain timing constraints (for example, constraints on tCCDR). And there can be a larger power draw on a memory die (e.g., on a DRAM die) using the 4N architecture. Accordingly, an HBM device implemented with a 4N architecture can have decreased bandwidth or increased latency compared to an HBM device implemented with an 8N architecture.

In the alternative, a 12H HBM device can be implemented with a mix of 4N memory dies and 8N memory dies. One example of such an HBM device is shown in FIG. 3, which illustrates the channel configuration of a HBM device 300. The HBM device 300 illustrates a 12H device, and includes a 4-Hi stack (e.g., Die8-Die11) and an 8-Hi stack (e.g., Die0-Die7). As illustrated in FIG. 1, the 4-Hi stack comprises four 4N memory dies Die8 to Die11, and the 8-Hi stack comprises eight 8N memory dies Die0 to Die7. Each of the 4N memory dies may provide twice the bandwidth of each of the 8N memory dies. That is, each 4N memory die may include 4N channels. And each 8N memory die may include 8N channels.

As illustrated in FIG. 3, a first half (e.g., four memory dies Die0-Die3) of the 8-Hi stack memory dies (i.e., memory dies Die0-Die7) can include 32 channels, and the banks of each of the 32 channels on the first half of dies can be associated with respective first pseudo channels (e.g., PC0) of the 32 channels. A second half (e.g., four memory dies Die4-Die7) of the 8-Hi stack memory dies (i.e., memory dies Die0-Die 7) can include the 32 channels, and the banks of each of the 32 channels on the second half of 8-Hi stack dies can be associated with respective second pseudo channels (e.g., PC1) of the 32 channels. The 4-Hi stack memory dies (i.e., memory dies Die8-Die11) can include 32 channels divided equally amongst the four memory dies, and the banks of each of the 32 channels can be divided equally amongst respective first pseudo channels (e.g., PC0) and second pseudo channels (e.g., PC1) of the 32 channels.

Power consumption and/or delivery of memory dies in the 12H HBM device 300 can be related to their corresponding memory bandwidth. For example, assuming the memory dies of the first stack of eight memory dies and the second stack of four memory dies of the 12H HBM device 300 are fabricated using a same memory technology and running at a similar operating frequency and voltage level, the power consumption/delivery on each memory dies of the 12H HBM device 300 can be proportional to its bandwidth. As a result, the bandwidths of memory dies can be used to illustrate the power deliver network in the 12H HBM device 300, e.g., a bandwidth variance between the memory dies Die0 to Die11 reveals the powder consumption and delivery variance among these memory dies.

To illustrate the bandwidth and corresponding power delivery therein, a specific memory device pin rate (e.g., a fastest operating speed rate of memory device through its input and output pins or connectors) can be defined in the present application. For example, a pin rate of 9.6 Gigabit per second (Gbps) is used to estimate the bandwidth of memory dies of the 12H HBM device 300. Here, a bandwidth of each memory die included in the 12H HBM device 300 can be calculated by multiplying the pin rate with number of channels included in each memory die and number of data buses (DQs) included in each channel. In this example, each memory die of the first stack of eight memory dies (i.e., memory dies Die0-Die7) includes 8 channels, each channel including 32 DQs. As a result, each memory die of the first stack of eight memory dies has a bandwidth of 2457.6 Gbps (e.g., 307.2 GB/s). Moreover, each memory dies of the second stack of four memory dies (i.e., memory dies Die8-Die11) includes 16 channels, each channel including 32 DQs. Therefore, each memory die of the second stack of four memory dies has a bandwidth of 4915.2 Gbps (e.g., 614.4 GB/s). The described pin rate and per-die bandwidths are intended to be for illustrative purposes. However, it will be appreciated that in the configuration of the illustrated 12H HBM device 300, implemented with a set of 8N memory dies (with 8N channels) and a set of 4N memory dies (with 8N channels), the different memory dies will provide different bandwidths corresponding to the bandwidth configurations of the channels therein (e.g., 4N or 8N).

In a HBM device, such as the 12H HBM device 300, stacked multiple memory dies are preferred to operate at a uniform power level to ensure data consistency and reliability. Uneven power distribution among stacked memory dies could result in performance disparities and increased risk of failure. In addition, uneven power distribution among memory dies can cause localized hotspots within the memory stack, leading to thermal dissipation issues. Further, a uniformed power distribution in the HBM device ensures that power is used efficiently, without overloading certain memory dies while underutilizing others. This is important for optimizing power efficiency in memory operations. To achieve uniform power distribution among memory dies in an HBM device (e.g., small power distribution variance among the memory dies), it is advantageous for the design and configuration of the memory dies to take into account the delivery power network, to ensure a consistent and reliable operation of the HBM device.

As shown in FIG. 3, the power distribution variance among the memory dies of the 12H HBM device 300 can be revealed by the bandwidth variance. In this example, a maximum memory die bandwidth exists in the second stack of four memory dies (i.e., memory dies Die8-Die11) and is 614.4 GB/s. In contrast, a minimum memory die bandwidth exists in the first stack of eight memory dies (i.e., memory dies Die0-Die7), and is 307.2 GB/s. The ratio of the maximum memory die bandwidth to the minimum memory die bandwidth is 2 (or 100% bandwidth delta). In fact, each of the second stack of four memory dies (i.e., memory dies Die8-Die11) has a bandwidth as twice as that of each of the first stack of eight memory dies (i.e., memory dies Die0-Die7). It can be estimated that the power distribution in the second stack memory dies is close to twice of that in the first stack memory dies.

Figure 4:
FIG. 4 illustrates channel configurations of an example memory device.

Various techniques may be used to help address the differences in bandwidth requirements (and similarly, power) of different memory dies of a stacked memory device. For example, mixed-bandwidth memory dies in which half of the channels of the memory die can be configured to operate in a first bandwidth mode (corresponding to a first bandwidth), and the other half of the channels of the memory die can be configured to operate in the first bandwidth mode or a second bandwidth mode (corresponding to a second bandwidth), may be used. For example, half of the channels of a memory die may be configured to operate as 8N channels, and the other half of the channels of the memory die may be configured to operate as 4N channels. FIG. 4 illustrates the channel configuration of a 12H HBM device 400, that includes a first stack of four memory dies (e.g., memory dies Die0-Die3) with half 4N channels and half 8N channels, a second stack of four memory dies (e.g., memory dies Die4-Die7) having 8N channels, and a third stack of four memory dies (e.g., memory dies Die8-Die11) having half 4N channels and half 8N channels. Here, each memory die of the first stack of memory dies can implement both the first and second pseudo channels for its first half of eight channels (e.g., CH0-CH3), while its second half of eight channels (e.g., CH4-CH7) being associated with a distinct pseudo channel (e.g., the first pseudo channels or the second pseudo channels). In this example, each memory die of the third stack of memory dies can implement both the first and second pseudo channels for its second half of eight channels (e.g., CH4-CH7), while its first half of eight channels (e.g., CH0-CH3) being associated with a distinct pseudo channel (e.g., the first pseudo channels or the second pseudo channels). Moreover, each of the second stack of four memory dies include 8 channels, and the second stack of memory dies can include a total of 32 channels. As shown in FIG. 4, the 12H HBM device 400 has 4N channels distributed across 8 memory dies out of the 12 memory dies of the 12H device.

Assuming a same pin rate of 9.6 Gbps for the 12H HBM device 400, a maximum memory die bandwidth for the first stack and third stack of memory dies (e.g., memory dies Die0-Die 3 and Die8-Die11) can be estimated as 460.8 GB/s. In contrast, a minimum memory die bandwidth can be estimated for the second stack of four memory dies (e.g., memory dies Die4-Die7) as 307.2 GB/s. The ratio of the maximum memory die bandwidth to the minimum memory die bandwidth of the 12H HBM device 400 is 1.5 (or 50% bandwidth delta). Here, each of the first stack and third stack of memory dies (e.g., memory dies Die0-Die3 and Die8-Die11) has a bandwidth 50% higher than that of each of the second stack of four memory dies (e.g., memory dies Die4-Die7). It can be estimated that the power distribution in the first and third stack memory dies is close to 50% higher of that in the second stack memory dies. That is, in comparison to the 12H HBM device 300, the 12H HBM device 400 shows an improved power distribution uniformity (e.g., power distribution delta between memory dies reduced from 100% to 50%.) That is, distributing the 4N channels across 8 of the 12 memory dies of the 12H HBM device 400, in contrast to concentrating the 4N channels within 4 memory dies in the 12H HBM device 300 illustrated in FIG. 3, decreases the bandwidth and power delta among the memory devices. However, such maximum bandwidth variance among memory dies of a HBM device (e.g., 50% bandwidth delta between the minimum and maximum bandwidth dies) is still high and an improved HBM device configuration is desired.

It will be appreciated that stacked memory devices formed from memory dies with different bandwidth capabilities (e.g., the 12H HBM device 300 and/or the 12H HBM device 400), can give rise to various shortcomings. For example, the memory dies with higher bandwidth capabilities may consume more power than the memory dies with lower bandwidth capabilities and/or place more demands on the power delivery system of the memory device. When the relative bandwidth capabilities of the dies are different enough (e.g., in the example above, some dies have 2× or 1.5× the bandwidth of other dies), the power consumption demands of the memory device may be particularly concentrated in a fewer number of memory dies (e.g., the higher bandwidth memory dies). For example, in the 12 HBM device 400 illustrated in FIG. 4, power consumption may be concentrated on the higher bandwidth hotspot memory dies. However, in other cases, the hotspot memory dies can be positioned anywhere in a 12H HBM device where power consumption is bottle-necked. It will be appreciated that when maximum power concentration is concentrated in one memory die or a fewer number of memory dies of a memory device, the memory device may suffer from poor heat concentration and strain on the power delivery to the memory device overall. For example, the power delivery network responsible for delivering power to the memory device could collapse. Therefore, a 12H HBM device with a smaller delta in the bandwidth requirements of the minimum and maximum bandwidth memory dies, and more uniform per-die power delivery network, is desired.

HBM Device with Fine-Grained Channel Configuration

To overcome the above and other shortcomings, the present technology includes a HBM device with fine-grained channel configuration of the memory devices therein. As described herein, fine-grained configuration of the channels of the memory device provides configuring each channel of the memory device differently and individually, thereby enabling distributing high bandwidth memory channels uniformly across all memory dies of the memory device. By distributing the high bandwidth memory channels across all memory dies of the HBM device, the efficiency of power delivery network in the memory dies, and HBM device in total, is improved (e.g., provides a HBM device with improved per-die power delivery). In some embodiments, the HBM device with improved per-die power delivery includes memory channels that are associated with a high bandwidth configuration (e.g., 4N channels, suitable for a 4N architecture) and a low bandwidth configuration (e.g., 8N channels, suitable for an 8N architecture). The memory channels having the high bandwidth configuration can be distributed across all 12 memory dies of a 12H HBM device configured in accordance with embodiments of the present technology. As a result, in some embodiments of the present technology, every memory device of the 12H HBM device can have a 4N:8N channel ratio of 2:6 (e.g., 2 4N channels and 6 8N channels) and/or 3:5. In contrast, conventional 12H HBM devices may have memory devices with all 4N channels, memory devices with no 4N channels, and/or memory devices with half 4N channels, thereby created a greater disparity between the bandwidth (and power) requirements of the memory devices. As described herein, various bandwidth configuration of the memory devices included in the present technology can be configured by operating electrical fuses couped to each of the memory channels of the memory devices. That is, in embodiments of the present technology, each memory device's channel can have a fuse to enable individually configuring the channel to operate as a 4N channel or an 8N channel. It will be appreciated that embodiments of the present technology provide for reduced variance of memory die bandwidth, enabled through the fine-grained channel configurations (e.g., per-channel fuses), which provides improved power delivery networks in the memory devices and HBM device.

Figure 5:
FIG. 5 illustrates channel configurations of a memory device with improved per-die power delivery, in accordance with one or more embodiments of the present technology.

In one aspect of the present technology, the 4N channels can be distributed across all 12 memory dies of the 12H HBM device. For example, FIG. 5 illustrates the channel configuration of a 12H HBM device 500 with improved per-die power delivery, in accordance with one or more embodiments of the present technology. The 12H HBM device 500 includes a first stack of four memory dies (e.g., memory dies Die0-Die3), a second stack of four memory dies (e.g., memory dies Die4-Die7), and a third stack of four memory dies (e.g., memory dies Die8-Die11), each memory die of the first, the second, and the third stack of four memory dies having one or more channels 4N channels and one or more 8N channels. As shown, the first stack of four memory dies (e.g., Die0 to Die3) each includes three channels (e.g., CH0-CH2) configured as 4N channels, and five channels (e.g., CH3-CH7) configured as 8N channels. In addition, the second stack of four memory dies (e.g., Die4 to Die7) each includes two channels (e.g., CH3 and CH7) configured as 4N channels, and six channels (e.g., CH0-CH2 and CH4-CH6) configured as 8N channels. Further, the third stack of four memory dies (e.g., Die8 to Die11) each includes three channels (e.g., CH4-CH6) configured as 4N channels, and five channels (e.g., CH0-CH3, and CH7) configured as 8N channels. As illustrated in FIG. 5, channels configured as 4N channels are distributed across all 12 memory dies of the 12H HBM device 500. As described herein, each of the channels of the memory dies (e.g., CH0-CH7 of Die0 to Die11) can be individually configured to operate as a 4N channel or an 8N channel (e.g., with the use of fuses). Further, in the illustrated HBM device 500, the ratio of the number of channels configured as 4N channels to the number of channels configured as 8N channels, within each memory die, is either 2:6 or 3:5.

As described herein, the power distribution variance among the memory dies of the 12H HBM device 500 can also be illustrated by reference to the memory die bandwidth variance. Here, a same pin rate of 9.6 Gbps can be adopted to the 12H HBM device 500 to estimate the bandwidth of memory dies included therein. In this example, a maximum memory die bandwidth exists in the first stack and third stack of memory dies (e.g., memory dies Die0-Die 3 and Die8-Die11) and is 422.4 GB/s. In contrast, a minimum memory die bandwidth exists in the second stack of four memory dies (e.g., memory dies Die4-Die7) and is 384 GB/s. The ratio of the maximum memory die bandwidth to the minimum memory die bandwidth of the 12H HBM device 500 is 1.1 (or 10% bandwidth delta). That is, each of the first stack and third stack of memory dies (e.g., memory dies Die0-Die 3 and Die8-Die11) has a bandwidth 10% higher than that of each of the second stack of four memory dies (e.g., memory dies Die4-Die7). It can be estimated that the power distribution in the first and third stack memory dies is approximately 10% higher of that in the second stack memory dies. In comparison to other HBM devices (e.g., 12H HBM device 300 and 12H HBM device 400), the 12H HBM device 500 shows a further improved power distribution uniformity (e.g., power distribution delta between memory dies further reduced to 10%).

In the present technology, the individual channels of each memory die can be configured independently to operate according to the 4N or 8N architecture based on the assembly of the HBM device (e.g., by programming a configuration register of the HBM device, blowing electronic fuses of the HBM device, etc.). Accordingly, each of the memory dies of the stacked memory device can be configured to operate to achieve an improved power delivery network in the 12H HBM device. HBM devices in accordance with some embodiments of the described technology, such as the 12H HBM device 500, may include a pair of TSV sets for each electrical fuse coupled to corresponding memory die channel. During the manufacturing of the memory HBM, the electrical fuses may not be blown to enable the pair of TSV sets and to operate corresponding memory die channel in a specific bandwidth mode (e.g., with the 8N architecture). In contrast, the electrical fuses can be blown to disable one TSV set of the pair of TSV sets and to operate the corresponding memory die channel in another bandwidth mode (e.g., with the 4N architecture).

In some embodiments, each channel of the memory dies included in the 12H HBM device 500 can have its own electronic fuse. The electronic fuse can be blown, during a manufacturing of the memory device, to configure the corresponding channel to operate as a 4N channel. In contrast, if a channel's corresponding electronic fuse has not been blown, the channel is configured to operate as an 8N channel. In some embodiments, each channel of a memory die is associated with two TSV sets and the fuse controls whether the channel uses one or both TSV sets during operation. For example, the electronic fuses of CH0-CH2 of the first stack of memory dies (e.g., memory dies Die0-Die3), CH3 and CH7 of the second stack of memory dies (e.g., memory dies Die4-Die7), and CH4-CH6 of the third stack of memory dies (e.g., memory dies Die8-Die11) can be blown, indicating those memory channels are operated with the 4N architecture in the HBM device 500.

Figure 6:
FIG. 6 illustrates channel configurations of a memory device with improved per-die power delivery, in accordance with one or more embodiments of the present technology.

In the present technology, it will be appreciated that the channels configured to operate as 4N channels do not have to be adjacent to each other in the above described 12H HBM devices. For example, FIG. 6 illustrates another channel configuration of a 12H HBM device 600 with improved per-die power delivery, in accordance with embodiments of the present technology. As illustrated in FIG. 6, the 12H HBM device 600 includes a first stack of four memory dies (e.g., memory dies Die0-Die3), a second stack of four memory dies (e.g., memory dies Die4-Die7), and a third stack of four memory dies (e.g., memory dies Die8-Die11), each memory die of the first, the second, and the third stack of four memory dies having one or more channels with both of the 4N and 8N architectures. In this example, the first stack of four memory dies (e.g., Die0 to Die3) each includes three channels (e.g., CH0, CH1, and CH3) having the 4N architecture and five channels (e.g., CH2, and CH4-CH7) having the 8N architecture. The first stack of four memory dies have a total of 44 channels. In addition, the second stack of four memory dies (e.g., Die4 to Die7) each includes two channels (e.g., CH2 and CH7) having the 4N architecture and six channels (e.g., CH0-CH1, and CH3-CH6) having the 8N architecture. The second stack of four memory dies have a total of 40 channels. Further, the third stack of four memory dies (e.g., Die8 to Die11) each includes three channels (e.g., CH4-CH6) having the 4N architecture and five channels (e.g., CH0-CH3, and CH7) having the 8N architecture.

As shown in FIG. 6, assuming a same pin rate of 9.6 Gbps 6, the bandwidth of memory dies of the 12H HBM device 600 can be respectively identical to corresponding memory dies of the 12H HBM device 500 described in FIG. 5. For example, a maximum memory die bandwidth exists in the first stack and third stack of memory dies (e.g., memory dies Die0-Die 3 and Die8-Die11) of the 12H HBM device 600 and is 422.4 GB/s. Further, a minimum memory die bandwidth exists in the second stack of four memory dies (e.g., memory dies Die4-Die7) of the 12H HBM device 600 and is 384 GB/s. The ratio of the maximum memory die bandwidth to the minimum memory die bandwidth of the 12H HBM device 600 is also 1.1 (or 10% bandwidth delta).

In this example, the channels having 4N architecture in the first stack or third stack of four memory dies in the 12H HBM device 600 do not have to be configured as continuous. For example, the channels having 4N architecture in the first stack of four memory dies can be configured as CH0, CH1, and CH3. Similarly, the channels having 4N architecture in the second stack of four memory dies can be configured as CH2 and CH7. That is, it will be appreciated that HBM devices with improved per-die power delivery, in accordance with embodiments of the present technology, can configure during channels of the memory dies to operate as 8N or 4N channels, in different configurations and patterns, in order to achieve the desired combination of 4N and 8N channels in the HBM device. In some embodiments, the distribution of 4N and 8N channels across the memory dies of the HBM device may follow certain configuration rules. For example, as described herein, in some embodiments each memory die of the HBM device includes either two or three channels, out of eight total channels, configured to operate as a 4N channels. As a further example, in some embodiments each channel (e.g., CH0-CH7) is configured as a 4N channel on 4 memory dies, and as an 8N channel on 8 memory dies. For example, as illustrated in FIG. 6, CH0 of the HBM device 600 is configured as a 4N channel on 4 dies (Die0 through Die 3) and 8N channels on the remaining dies, CH2 is configured as a 4N channel on 4 dies (Die4 through Die7) and 8N channels on the remaining dies, etc.

In this example, each channel of the memory dies included in the 12H HBM device 600 can have its own electronic fuse to configure whether the channel is operated with the 4N architecture or the 8N architecture. Here, the electronic fuses connected to corresponding memory die channels of the 12H HBM device 600 can be blown to indicate that its corresponding channel is operated with the 4N architecture. Alternatively, a non-blowen electronic fuse can be used to indicate its corresponding channel is operated with the 8N architecture. In this example, the electronic fuses of CH0, CH1, and CH3 of the first stack of memory dies (e.g., memory dies Die0-Die3), CH2 and CH7 of the second stack of memory dies (e.g., memory dies Die4-Die7), and CH4-CH6 of the third stack of memory dies (e.g., memory dies Die8-Die11) can be blown, indicating their corresponding memory channels are operated with the 4N architecture.

Although embodiments of an HBM device with improved per-die power delivery have been described with reference to memory dies having eight channels each, where two or three of each memory die's channels are configured to operate as full-bandwidth (e.g., 4N) channels, it will be appreciated that other configurations are possible. For example, one or more memory dies of the HBM device can have fewer than 8 channels, more than 8 channels, etc. As a further example, one or more memory dies may have different number of channels configured to operate as 4N channels and channels configured to operate as 8N channels, depending on the total number of channels of the memory die, the total number of memory die in the HBM device, etc. It will be appreciated that the channels of the HBM device may be configured so as to minimize the relative bandwidth of memory dies with the highest bandwidth and memory dies with the lowest bandwidth. As a further example, the HBM device may have more than 12 memory dies.

FIG. 7 is a flow chart illustrating a method 700 of providing improved power delivery in a memory device according to the embodiments of the present technology. The method 700 includes providing the memory device comprising a vertical stack of memory dies, a channel-mix setting, and a plurality of electrical fuses each being associated with corresponding memory channel, each memory die comprising a mode selection circuit, a set of memory channels, and a die ID (DID) (step 710). The method 700 further includes determining, in each die's mode selection circuit, a bandwidth mode from a set of bandwidth modes for each memory channel based on a position of the memory channel on the die, the DID of the die, and the channel-mix setting of the memory device (step 720). The method 700 additionally includes configuring the plurality of electrical fuses, in accordance with the determined bandwidth mode to each of the memory channels, to operate each of the memory channels in corresponding bandwidth mode (step 730).

Example Operating Environment

Figure 8:
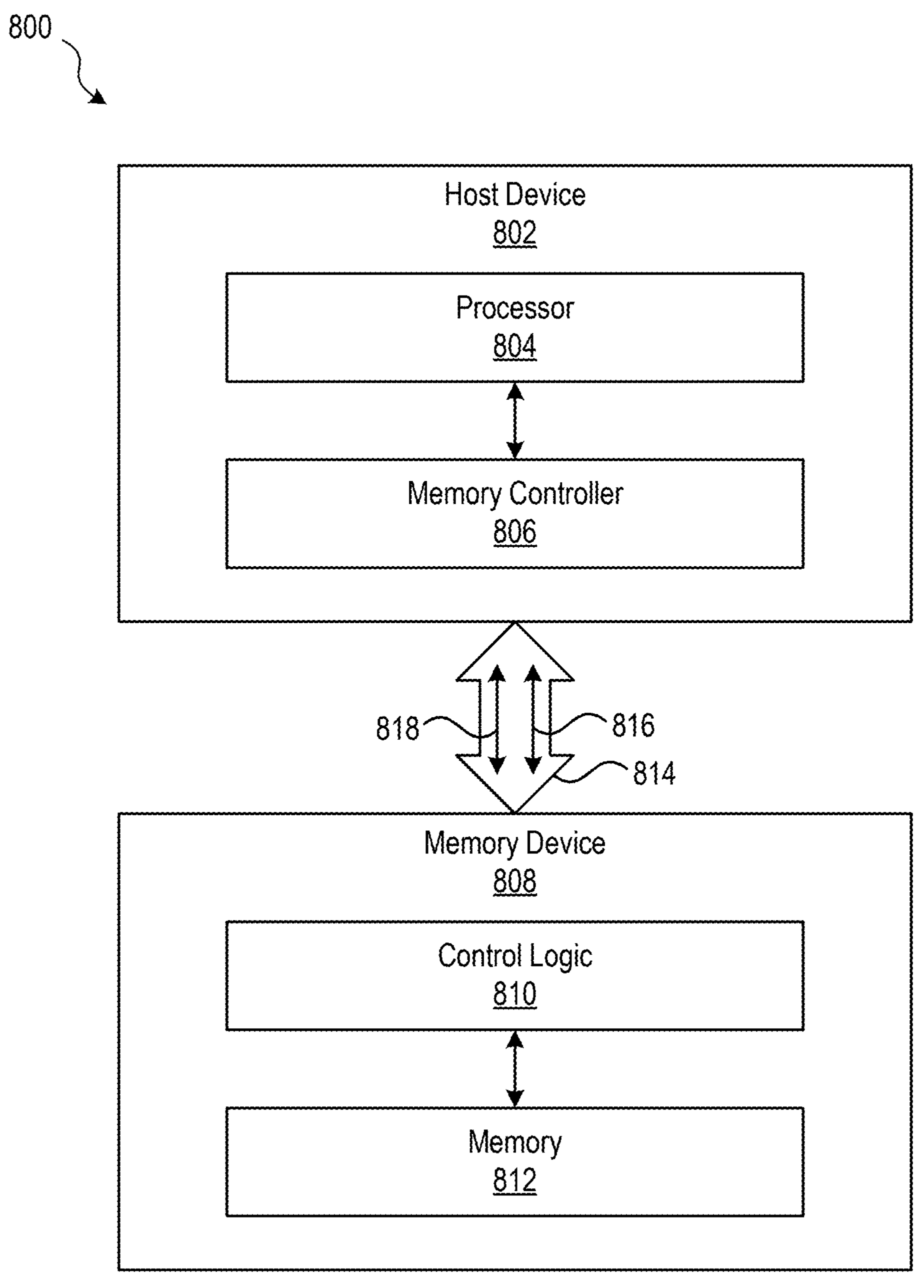
FIG. 8 illustrates an example operating environment for a memory device in accordance with one or more embodiments of the present technology.

FIG. 8 illustrates an example computing device 800 in which various techniques and devices described in this document can operate. The computing device 800 includes a host device 802, which has at least one processor 804 and at least one memory controller 806, and a memory device 808, which includes control logic 810 and memory 812. In some examples, memory controller 806 may be an aspect of, and may reside on or within, the processor 804. The computing device 800 further includes an interconnect 814. The computing device 800 can be any type of computing device, computing equipment, computing system, or electronic device, for example, hand-held devices (e.g., mobile phones, tablets, digital readers, and digital audio players), computers, vehicles, or appliances. Components of the computing device 800 may be housed in a single unit or distributed over multiple, interconnected units (e.g., through wired or wireless interconnects). In aspects, the host device 802 and the memory device 808 are discrete components mounted to and electrically coupled through an interposer (e.g., implementing a portion of the interconnect 814).

As shown, the host device 802 and the memory device 808 are coupled with one another through the interconnect 814. The processor 804 executes instructions that cause the memory controller 806 of the host device 802 to send signals on the interconnect 814 that control operations at the memory device 808. The memory device 808 can similarly communicate data to the host device 802 over the interconnect 814. The interconnect 814 can include one or more CA buses 816 or one or more DQ buses 818. The CA buses 816 can communicate control signaling indicative of commands to be performed at select locations (e.g., addresses) of the memory device 808. The DQ buses 818 can communicate data between the host device 802 and the memory device 808. For example, the DQ buses 818 can be used to communicate data to be stored in the memory device 808 in accordance with a write request, data retrieved from memory device 808 in accordance with a read request, or an acknowledgement returned from the memory device 808 in response to successfully performing operations (e.g., a write operation) at the memory device 808. The CA buses 816 can be realized using a group of wires, and the DQ buses 818 can encompass a different group of wires of the interconnect 814. As some examples, the interconnect 814 can include a front-side bus, a memory bus, an internal bus, peripheral control interface (PCI) bus, etc.

The processor 804 can read from and write to the memory device 808 through the memory controller 806. The processor 804 may include the computing device's: host processor, central processing unit (CPU), graphics processing unit (GPU), artificial intelligence (AI) processor (e.g., a neural-network accelerator), or other hardware processor or processing unit.

The memory device 808 can be integrated within the host device 802 or separate from the computing device 800. The memory device 808 can include any memory 812, such as integrated circuit memory, dynamic memory, random-access memory (e.g., dynamic random-access memory (DRAM), static random-access memory (SRAM)), or flash memory to name just a few. The memory device 808 can include memory 812 of a single type or memory 812 of multiple types. In general, the memory device 808 can be implemented as any addressable memory having identifiable locations of physical storage. The memory device 808 can include memory-side control logic 810 that executes commands from the memory controller 806. For example, the control logic 810 can decode signals from the memory controller 806 and perform operations at the memory 812.

As a specific example, the memory device 808 can include a HBM device, e.g., the 12H HBM devices 500 and/or 600 described earlier in this disclosure. For example, the memory device 808 can include an interface die implementing at least a portion of the memory-side control logic 810 and one or more memory 812 (e.g., memory dies) stacked to the interface die. The memory-side control logic 810 can receive commands from the memory controller 806 through the interconnect 814 and communicate signaling to execute the commands at the memory 812 in an improved manner compared to other memory devices (e.g., with a higher bandwidth). The interconnect 814 can similarly be implemented in accordance with the HBM device. For example, the interconnect 814 can include 32 channels further divided into two pseudo channels per channel. Each channel can be coupled to a CA bus, and each pseudo channel can transmit or receive data through a respective DQ bus. Thus, the interconnect 814 can include twice as many DQ buses 818 (e.g., 64 DQ buses) as CA buses 816 (e.g., 32 CA buses).

Any one of the semiconductor devices and semiconductor device assemblies described above with reference to FIGS. 5 to 8 can be incorporated into any of a myriad of larger and/or more complex systems, a representative example of which is system 900 shown schematically in FIG. 9. The system 900 can include a semiconductor device assembly (e.g., or a discrete semiconductor device) 902, a power source 904, a driver 906, a processor 908, and/or other subsystems or components 910. The semiconductor device assembly 902 can include features generally similar to those of the HBM devices described above with reference to FIGS. 5 to 8. The resulting system 900 can perform any of a wide variety of functions, such as memory storage, data processing, and/or other suitable functions. Accordingly, representative systems 900 can include, without limitation, hand-held devices (e.g., mobile phones, tablets, digital readers, and digital audio players), computers, vehicles, appliances and other products. Components of the system 900 may be housed in a single unit or distributed over multiple, interconnected units (e.g., through a communications network). The components of the system 900 can also include remote devices and any of a wide variety of computer readable media.

Although in foregoing examples embodiments have been illustrated and described as HBM devices, in other embodiments these can be flash memory packages, graphics memory packages, DDR, or GDDR with multiple memory dies. Likewise, the 8N and 4N channels can be replaced by channels of higher or lower bandwidths (e.g., channels with bandwidths for which greater or fewer number of memory dies of that bandwidth are needed to satisfy a bandwidth requirement). By extension, the distribution of high- and low-bandwidth channels throughout the memory device can be different from what has been illustrated and described.

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:

a plurality of memory dies positioned in a stack, the plurality of memory dies comprising:

a first set of memory dies having a first number of channels configured according to a first configuration and a second number of channels configured according to a second configuration, wherein the first configuration comprises channels configured to have a first bandwidth and operate in a first bandwidth mode, and the second configuration comprises channels configured to have a second bandwidth and operate in a second bandwidth mode; and a second set of memory dies having a third number of channels configured according to the first configuration and a fourth number of channels configured according to the second configuration, wherein the first bandwidth is larger than the second bandwidth, the first number is larger than the third number, and the second number is larger than the fourth number.

2. The memory device of claim 1, wherein the memory device comprises twelve memory dies positioned in the stack, and wherein each of the twelve memory dies comprises eight memory die channels.

3. The memory device of claim 2, wherein the first set of memory dies are eight memory dies and the second set of memory dies are four memory dies.

4. The memory device of claim 2, wherein a first ratio of the first number to the second number is 3:5, and a second ratio of the third number to the fourth number is 2:6.

5. The memory device of claim 1, wherein the first bandwidth mode includes a 4N architecture with which the first number of channels of the first set of memory dies and the third number of channels of the second set of memory dies each associates with a corresponding first pseudo channel and a corresponding second pseudo channel.

6. The memory device of claim 5, wherein the second bandwidth mode includes an 8N architecture with which the second number of channels of the first set of memory dies and the fourth number of channels of the second set of memory dies each associates with a corresponding single pseudo channel.

7. The memory device of claim 5, wherein the first bandwidth is twice of the second bandwidth.

8. The memory device of claim 1, further comprising a plurality of electrical fuses, each of the plurality of fuses being associated with corresponding each channel of the first set of memory dies and the second set of memory dies.

9. The memory device of claim 8, wherein each of the plurality of electrical fuses is configured to control corresponding memory die channel of the plurality of memory dies to operate in the first bandwidth mode or the second bandwidth mode.

10. The memory device of claim 8, further comprising a pair of through silicon via (TSV) sets associated with corresponding each of the plurality of electrical fuses and each of the set of memory die channels of the plurality of memory dies.

11. The memory device of claim 1, wherein the memory device comprises more than twelve memory dies positioned in the stack.

12. The memory device of claim 1, wherein the memory device is a high bandwidth memory (HBM) cube, wherein the plurality of memory dies comprises a 12H stack of core DRAM dies, and wherein the first bandwidth mode comprises a 4N bandwidth mode and the second bandwidth mode comprises an 8N bandwidth mode.

13. The memory device of claim 1, wherein the memory device comprises an interface die connected to the plurality of memory dies, wherein each die in the plurality of memory dies comprises a mode selection circuit configured to select the first bandwidth mode or the second bandwidth mode based on a position of the die in the stack, a position of the channel on the die, and a channel-mix setting for the memory device, and wherein the interface die is configured to control the mode selection circuit for each die.

14. A method of operating a memory device, the method comprising:

providing the memory device comprising a vertical stack of memory dies, a channel-mix setting, and a plurality of electrical fuses each being associated with corresponding memory channel, each memory die comprising a mode selection circuit, a set of memory channels, and a die ID (DID);

in each die's mode selection circuit, determining a bandwidth mode from a set of bandwidth modes for each memory channel based on a position of the memory channel on the die, the DID of the die, and the channel-mix setting of the memory device; and configuring the plurality of electrical fuses, in accordance with the determined bandwidth mode to each of the memory channels, to operate each of the memory channels in corresponding bandwidth mode.

15. The method of claim 14, wherein the DID depends on a position of the memory die in the memory device.

16. The method of claim 14, wherein the set of bandwidth modes includes a first bandwidth mode and a second bandwidth mode, and wherein the first bandwidth mode has twice of the bandwidth as the second bandwidth mode.

17. The method of claim 16, wherein each of the plurality of electrical fuses can be blown to operate corresponding memory channel in the first bandwidth mode, and wherein each of the plurality of electrical fuses can be not blown to operate corresponding memory channel in the second bandwidth mode.

18. A memory device, comprising:

a plurality of memory dies, each of the memory dies comprising:

a first set of full-bandwidth memory die channels operating in a full-bandwidth mode;

a second set of half-bandwidth memory die channels operating in a half-bandwidth mode, wherein the second set of half-bandwidth channels are disposed on a portion of each memory die not occupied by the first set of full-bandwidth memory channels; and a plurality of electrical fuses, each of the plurality of electrical fuses being associated with corresponding memory die channels of the plurality of memory dies, wherein the plurality of fuses are configured to control corresponding memory die channels of the plurality of memory dies to operate in the full-bandwidth mode or the half-bandwidth mode.

19. The memory device of claim 18, wherein the memory device comprises twelve memory dies positioned in a stack, and wherein each of the twelve memory dies comprises eight memory die channels.

20. The memory device of claim 19, wherein the first set of full-bandwidth memory die channels is equal to or less than three, and wherein the second set of full-bandwidth memory die channels is equal to or higher than five.

* * * * *